(12) United States Patent
Schaper

(10) Patent No.: US 6,800,939 B2
(45) Date of Patent: Oct. 5, 2004

(54) APPARATUS AND METHOD FOR PROVIDING LOW-LOSS TRANSMISSION LINES IN INTERCONNECTED MESH PLANE SYSTEMS

(75) Inventor: Leonard W. Schaper, Fayetteville, AR (US)

(73) Assignee: The Board of Trustees for the University of Arkansas, Fayetteville, AR (US)

( * ) Notice: Subject to any disclaimer, the term of this patent is extended or adjusted under 35 U.S.C. 154(b) by 43 days.

(21) Appl. No.: 10/156,772

(22) Filed: May 29, 2002

(65) Prior Publication Data

US 2003/0222288 A1 Dec. 4, 2003

(51) Int. Cl.[7] .............................................. H01L 23/485
(52) U.S. Cl. ....................... 257/758; 257/659; 257/664; 361/777; 361/778; 174/261
(58) Field of Search ................................ 257/758, 920, 257/208, 211, 659, 664; 361/777, 778; 174/255, 261

(56) References Cited

U.S. PATENT DOCUMENTS

| | | | |
|---|---|---|---|
| 4,703,288 A | 10/1987 | Frye et al. ..................... 333/1 |
| 4,866,507 A * | 9/1989 | Jacobs et al. ................ 174/258 |
| 5,408,053 A | 4/1995 | Young ......................... 174/264 |
| 5,410,107 A | 4/1995 | Schaper ....................... 174/255 |
| 5,764,489 A | 6/1998 | Leigh et al. ................. 361/777 |
| 5,925,925 A | 7/1999 | Dehaine et al. ............. 257/659 |
| 5,986,893 A | 11/1999 | Leigh et al. ................. 361/777 |
| 6,081,026 A | 6/2000 | Wang et al. ................. 257/700 |
| 6,172,305 B1 | 1/2001 | Tanahashi ................... 174/255 |
| 6,184,477 B1 | 2/2001 | Tanahashi ................... 174/261 |
| 6,255,600 B1 | 7/2001 | Schaper ....................... 174/255 |
| 6,483,714 B1 * | 11/2002 | Kabumoto et al. ......... 361/760 |
| 6,528,734 B2 * | 3/2003 | Mizunashi ................... 174/255 |

* cited by examiner

Primary Examiner—Jerome Jackson
Assistant Examiner—Matthew Landau
(74) Attorney, Agent, or Firm—Miles & Stockbridge P.C.

(57) ABSTRACT

An interconnected mesh plane system includes at least a pair of adjacent metal layers separated by dielectric, each layer having a plurality of spaced power, ground, and signal conductors extending in the same direction, with the conductors of one layer of the pair transverse to the conductors of the other layer, and with conductors of one layer connected to corresponding conductors of the other layer. The width of at least one signal conductor is increased to reduce signal loss, and the width of spaces between such a signal conductor and adjacent power and/or ground conductors is increased to provide a predetermined desired characteristic impedance of a transmission line that includes such a signal conductor.

20 Claims, 4 Drawing Sheets

APPARATUS AND METHOD FOR PROVIDING LOW-LOSS TRANSMISSION LINES IN INTERCONNECTED MESH PLANE SYSTEMS

BACKGROUND OF THE INVENTION

Interconnect substrates for portable and wireless equipment need to be thin and light. Because this type of equipment combines digital and RF circuitry, the interconnect medium needs to have a large interconnect capability (cm/cm$^2$ of wire) for the digital circuitry, and also have the capability to provide controlled impedance, low loss transmission lines for critical RF circuitry.

Traditionally, these needs have been met by providing buried stripline structures, in which X and Y signal layers are sandwiched between power and ground planes, which provide the AC ground reference for the transmission lines, as well as low impedance power distribution for all circuitry. A circuit board may have 4 or 6 layers of metal, with outermost pad layers for attaching components, which may also carry sections of power distribution planes or signal lines. These pad layers may form the reference planes, or the planes may be carried on another inboard set of metal layers.

A problem with using any form of buried stripline transmission line is that, once the manufacturing process has determined a reasonable thickness for the layers of dielectric insulator, the impedance of the line and the loss of the line are no longer independent. The impedance is determined by the width and height of the metal line, the distance between the line and the power and ground planes, and the dielectric constant of the insulating layers. The manufacturing process usually determines the thickness of conducting and insulating layers and the dielectric constant of the insulating material. For portable equipment, thin dielectric layers are desirable.

Thus, to achieve a particular characteristic impedance, of the line, which typically might be 50 ohms, the only variable left to the designer is the width of the line. However, setting the width of the line also establishes the cross-section and thus the resistance of the line, and therefore the loss. Circuit designers have no choice but to live with the resulting loss, which, with thin dielectrics and narrow lines, can be considerable.

BRIEF DESCRIPTION OF THE INVENTION

U.S. Pat. No. 5,410,107 issued Apr. 25, 1995 and U.S. Pat. No. 6,255,600 issued Aug. 3, 2001, to this inventor (both incorporated herein by reference), describe examples of inter-connected mesh plane system (IMPS) power distribution topologies, in which X and Y metal line segments, on different physical layers, are connected by vias to form electrical power distribution planes. Signal lines, also consisting of X and Y segments, are included between power and ground segments. The complete structure, which may include any number of physical X and Y layer pairs, can provide low impedance planar power distribution for multiple voltages, as well as dense wiring capability. This capability has been demonstrated in as few as 2 metal layers.

It has also been demonstrated that the signal lines are controlled impedance transmission lines, which function well into the multi-GHz frequency range. Return currents, rather than being carried by solid planes which underlie the signal paths, as in the traditional microstrip or stripline configurations, instead are carried on the parallel, coplanar power and ground segments adjacent to the signal line segments. When an X signal segment connects to a Y signal segment on a different metal layer, the return current follows the signal current path through the vias which connect the power and ground segments.

In a mesh plane configuration, the impedance of a transmission line is mainly determined by the width of a signal conductor segment, and the distance between this conductor and the adjacent ground return path conductors (which may be power and/or ground conductors, which are at AC ground potential). Because the orthogonal conducting segments on adjacent metal layers cannot carry current in the direction of signal propagation, the dielectric layer thickness has much less effect on the characteristic impedance of the transmission line. The present invention takes advantage of the discovery that the mesh plane configuration provides an additional degree of freedom in design, which can be used to independently determine the impedance and loss of the line.

More particularly, the width of a signal line intended to carry RF current, for example, and the width of adjacent ground and/or power lines can be increased compared to the width in a basic configuration, to reduce current losses. In addition, the space between the signal line and the adjacent lines is increased compared to a basic configuration, to obtain or maintain a desired transmission line characteristic impedance.

BRIEF DESCRIPTION OF THE DRAWINGS

The invention will be further described in conjunction with the accompanying drawings, which illustrate preferred (best mode) embodiments, and wherein.

DETAILED DESCRIPTION OF THE INVENTION

Figure 1:
FIG. 1 is a diagrammatic end view of power, ground, and signal lines in a basic configuration.
Figure 2:
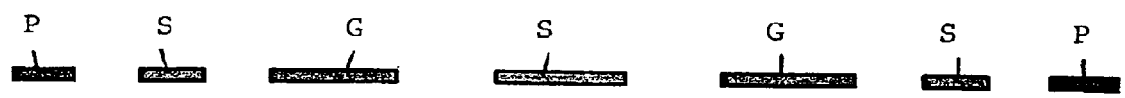
FIG. 2 is a similar view illustrating a modification of the basic configuration in accordance with one embodiment of the invention.
Figure 3:
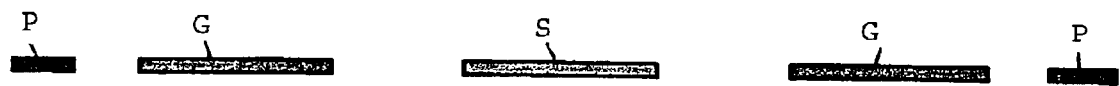
FIG. 3 is a similar view illustrating a further modification of the basic configuration in accordance with a second embodiment of the invention.

FIGS. 1–3 are diagrammatic end views, each showing only a portion of a metal layer of an interconnected mesh plane system, that, in practice, would include at least two metal layers separated by dielectric and with conductors (lines) of one metal layer extending in a direction that is transverse (preferably orthogonal) to conductors (lines) of the other metal layer.

FIG. 1 shows a portion of a basic layer configuration with signal conductors (S) interposed between adjacent power (P) and ground (G) conductors. All of the conductors have equal width and are equally spaced. Though any transmission line that includes one of the signal conductors will have the same designed impedance, determined by the signal conductor width and the width of the spaces between the signal conductor and adjacent conductors, the line may have a higher loss than desired because of the narrow conductor width.

FIG. 2 shows an embodiment of the invention with lower signal loss. In this embodiment, the central power conductor and the adjacent signal conductors of FIG. 1 have been replaced by a central signal conductor of substantially greater width than the conductors of FIG. 1 (e.g., twice the width) to reduce signal loss. The width of the ground conductors adjacent to the wider signal conductor has also been increased by the same amount to reduce return current loss. The spaces between the wider signal conductor and the adjacent wider ground conductors have also been increased so as to provide the same characteristic impedance as that of other transmission lines in the layer.

FIG. 3 shows a further embodiment, in which two signal conductors have been deleted, and in which the width of the central signal conductor and the adjacent ground conductors has been further increased (e.g., to three times the width of the conductors in FIG. 1). The spaces between the central signal conductor and the adjacent ground conductors have also been increased to preserve the desired characteristic impedance.

Although the configuration of the embodiments of FIGS. 2 and 3 results in fewer power and signal conductors, the redundancy in the conductor arrangement in each metal layer (only a small portion of which is shown in FIGS. 1–3) makes the loss of conductors inconsequential. Of course, building transmission lines of this kind reduces the available line density, but typically only a few signal paths in the RF portion of an interconnect layer will require the low-loss treatment, and the necessary line density in the RF circuitry is generally lower than in the digital portion. Thus the mesh topology allows a tradeoff between line density and line loss, all with the desired controlled impedance, a tradeoff impossible in conventional interconnect topologies.

FIGS. 4–7 illustrate another embodiment of the invention and show in greater detail application of the invention to an interconnected mesh plane system comprising a pair of metal layers that are superimposed upon opposite sides of a dielectric layer. For convenience of description, the layer shown in FIG. 4 may be termed a "top" layer, and the layer shown in FIG. 5 may be termed a "bottom" layer, although it will be apparent that the designation of the layers can be reversed and that the layers need not be arranged horizontally.

Figure 7:
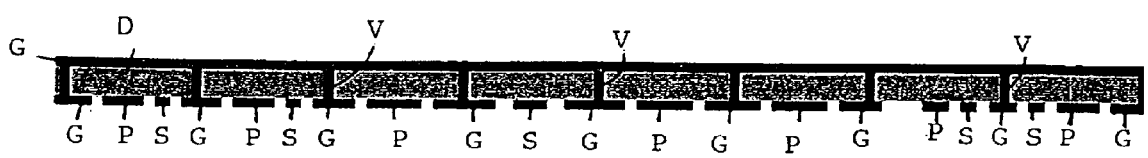
FIG. 7 is a cross-sectional view taken along line 7—7 in FIG. 6.
Figure 6:
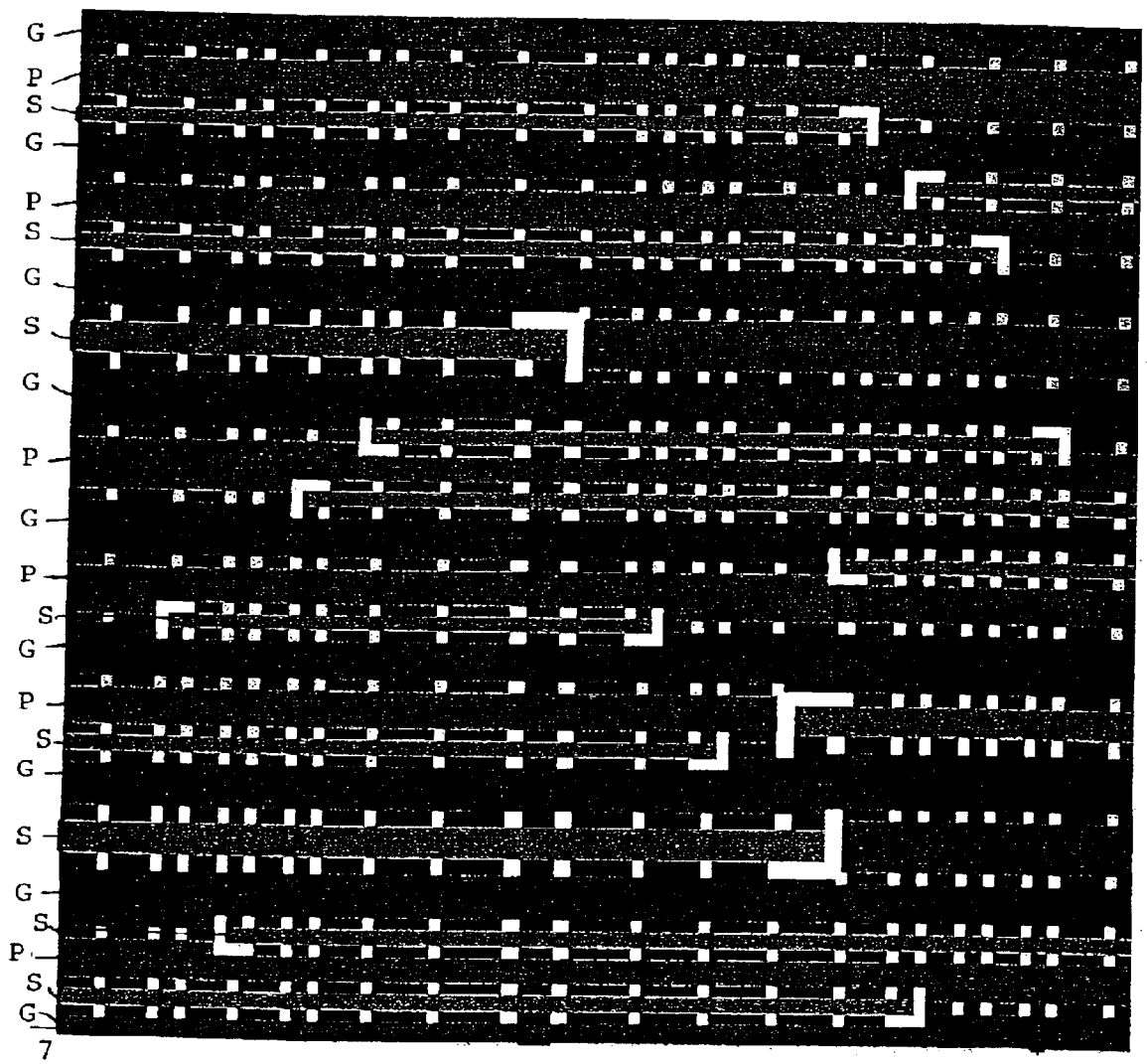
FIG. 6 is a top plan view showing the metal layers superimposed, but omitting a showing of dielectric between the layers.

Each layer comprises a plurality of power (P), ground (G), and signal (S) conductors (lines), and in the embodiment all of the conductors of a layer extend in the same direction, g with the conductors of one layer extending transversely (preferably orthogonally) to the conductors of the other layer. FIG. 6 shows the top layer superimposed upon the bottom layer. The interposed dielectric layer (D) is shown in FIG. 7.

In the conductor configuration of FIGS. 4–7, each signal conductor (S) is separated by spaces from adjacent power (P) and ground (G) conductors, and where no signal conductors are present, power and ground conductors are arranged alternately. Where reducing signal loss is not a consideration, the signal conductors have the same minimum width, and the spaces between those signal conductors and adjacent power or ground conductors have the same minimum width, providing a desired transmission line characteristic impedance.

Where reducing signal loss is desired, the width of signal conductors is increased, and the width of spaces between the wider signal conductors and the adjacent power and/or ground conductors is also increased to preserve the desired characteristic impedance. The width of the adjacent power or ground conductors is made sufficient to reduce return current loss. As is apparent in FIGS. 4–7, where no signal conductors are present, the power and ground conductors are wide enough to make maximum utilization of the metal.

Figure 4:
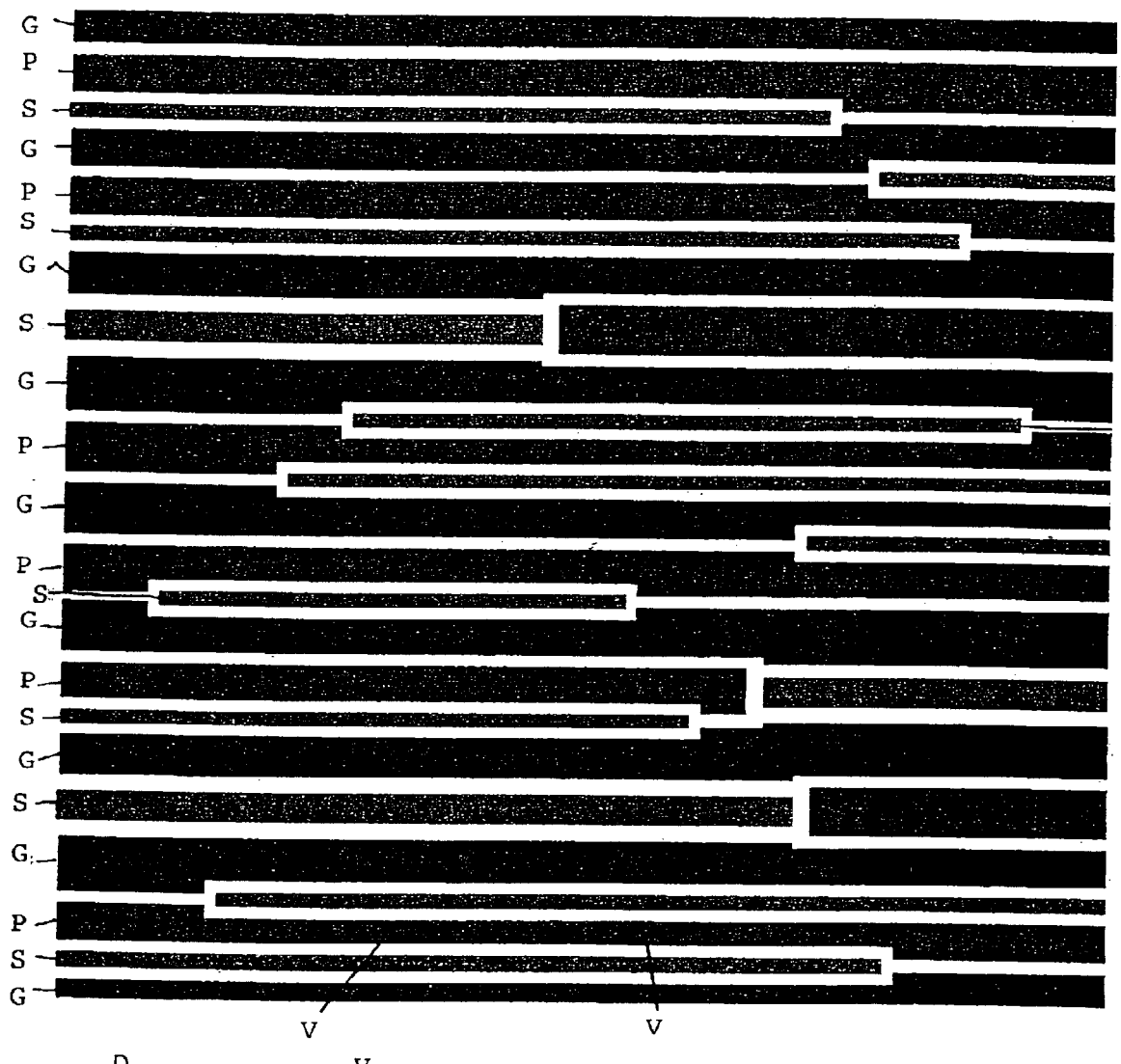
FIG. 4 is a top plan view of a metal layer employed in a third embodiment of the invention.
Figure 5:
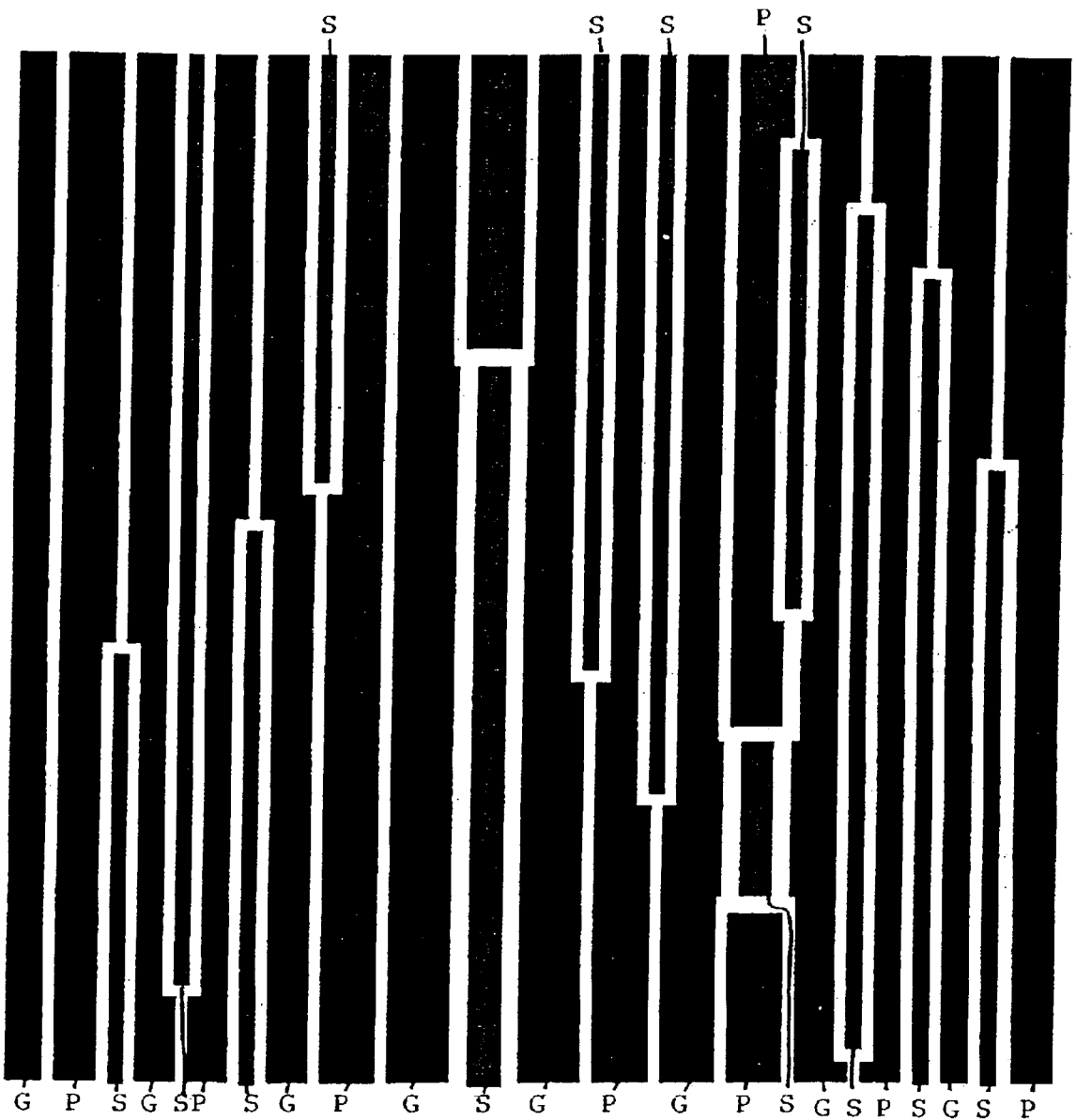
FIG. 5 is a top plan view of another metal layer employed in the third embodiment.

In an interconnected mesh plane system, conductors of the same type (i.e., power, ground, or signal) on adjacent layers are interconnected by vias. The dots (V) in FIGS. 4–6 represent such vias. In FIG. 7, the interconnections (V) of ground conductors on two layers are shown.

It is apparent that the invention is not limited to a pair of metal layers and that a complete interconnected mesh plane system may include 4, 6, or an even greater number of metal layers, with each pair of adjacent metal layers being separated by dielectric, and with the conductors of each pair of adjacent metal layers extending transversely to one another. In a basic configuration, power and ground conductors may alternate, but where signal conductors are present, the conductors adjacent to a signal conductor may be power conductors, ground conductors, or a power conductor on one side of the signal conductor and a ground conductor on the opposite side (both power and ground conductors being at AC ground potential).

It is apparent that the invention can be used in many different environments. The U.S. patents referred to earlier describe the application of IMPS to multichip modules (MCM), for example, in which mesh plane layers of an MCM can be formed on a base substrate, which may be formed of insulation material or provided with an insulating layer. Pads can be provided to interconnect chips, passive components, and an MCM package or to provide exterior connections. Additional dielectric layers can be provided to protect against corrosion and mechanical damage, for example. All of such prior technology can be used in connection with the present invention, when desired.

The parameters of interconnected mesh plane systems in accordance with the invention depend, inter alia, on the materials and manufacturing technology for a substrate. Material sets of interest include, but are not limited to, cofired alumina, Low Temperature Cofired Ceramic (LTCC), microvia printed wiring boards (PWB), Kapton or other Flex, and MCM-D on silicon or other substrates.

Assume, for example, a 50 ohm impedance transmission line in a basic IMPS configuration, where the signal and power/ground lines are minimum width to achieve maximum interconnect density, and the dielectric thickness and dielectric constant are defined by the material. The following table gives typical parameter values:

|  | Alumina | LTCC | PWB | Flex | MCM-D |
| --- | --- | --- | --- | --- | --- |
| Mm signal line width (mils) | 5 | 4 | 3 | 2 | 1 |
| Space for 50 ohm (est.) | 5 | 3 | 2 | 1 | 1 |
| Dielectric thickness | 8 | 6 | 1 | 2 | .5 |
| Dielectric constant | 9–10 | 6 | 4–5 | 3.5 | 3.5 |
| Low loss line width (2X) | 10 | 8 | 6 | 4 | 2 |
| Low loss line space to ground (2X) | 12 | 8 | 5 | 2 | 1.5 |
| Low loss line width (3X) | 15 | 12 | 9 | 6 | 3 |
| Low loss line space to ground (3X) | 20 | 14 | 9 | 4 | 3 |

While preferred embodiments of the invention have been shown and described, it will be apparent to those skilled in the art that these embodiments are merely illustrative of the invention, and that various modifications can be made without departing from the principles and spirit of the invention, the scope of which is defined in the appended claims.

As one example of a modification, one metal layer with conductors running in a given direction can be associated with adjacent metal layers at opposite sides thereof, each of which has conductors running transversely to conductors of the one metal layer.

As another example, one metal layer can be partitioned into different areas, each of which has conductors running in Hi; a given direction, which may be different from the direction of conductors in other areas. An adjacent metal layer, similarly partitioned, would have conductors in each area extending transversely to the conductors of the corresponding area of the one metal layer.

As a further example, groups of conductors on one metal layer can extend parallel to corresponding edges of the metal layer (like a rectangular donut, for instance), with conductors of an adjacent metal layer extending transversely to conductors of the one metal layer.

As yet another example, conductors of each of successive groups of conductors on one metal layer can extend in a direction that is the same for the conductors of that group, but with the directions changing from group to group, such as a continuous progression of direction changes, with each group forming a "spoke" of a radial array for instance. Again, conductors of an adjacent metal layer would be arranged transversely to corresponding conductors of the one metal layer.

As still another example, individual conductors of one metal layer can be arranged as spokes of a radial array centered on an active component, with conductors of an adjacent metal layer extending circumferentially so as to be transverse to corresponding conductors of the radial array.

What is claimed is:

1. An interconnected mesh plane system including a pair of adjacent metal layers separated by dielectric, in which each layer comprises a plurality of spaced power, ground, and signal conductors extending in the same direction, the conductors of one layer of the pair are transverse to the conductors of the other layer of the pair, and vias interconnect corresponding conductors on the adjacent layers, characterized in that at least one signal conductor has substantially greater width than the width of other signal conductors and is separated from adjacent conductors by spaces that are substantially wider than spaces between other signal conductors and adjacent conductors, the greater width of said at least one signal conductor providing less signal loss than other signal conductors, and the greater width and wider spaces providing a predetermined desired characteristic impedance of a transmission line that includes the at least one signal conductor.

2. An interconnected mesh plane system according to claim 1, wherein the width of conductors adjacent to the at least one signal conductor is greater than the width of some other conductors adjacent to some other signal conductors.

3. An interconnected mesh plane system according to claim 1, wherein the characteristic impedance of the transmission line that includes the at least one signal conductor is substantially the same as the characteristic impedance of other transmission lines that include other signal conductors.

4. A method of manufacturing an interconnected mesh plane system, comprising:

providing first and second adjacent metal layers separated by dielectric, wherein the first layer has a plurality of spaced conductors extending in a first direction and the second layer has a plurality of spaced conductors extending in a second direction transverse to the first direction, and wherein the conductors of each layer include power conductors, ground conductors, and signal conductors between adjacent power or ground conductors;

interconnecting power conductors of the first layer with power conductors of the second layer, ground conductors of the first layer with ground conductors of the second layer, and signal conductors of the first layer with signal conductors of the second layer;

providing at least one signal conductor with a width that is substantially greater than the width of other signal conductors to reduce signal loss; and providing spaces between the at least one signal conductor and adjacent conductors that are substantially wider than spaces between other signal conductors and adjacent conductors, the greater width and wider spaces providing a predetermined characteristic impedance of a transmission line that includes the at least one signal conductor.

5. A method according to claim 4, wherein the width of the conductors adjacent to the at least one signal conductor is substantially greater than the width of some other conductors adjacent to some other signal conductors, to reduce return current loss.

6. A method according to claim 4, wherein the characteristic impedance of the transmission line that includes the at least one signal conductor is substantially the same as the characteristic impedance of other transmission lines that include other signal conductors.

7. A method of designing an interconnected mesh plane system that includes a pair of metal layers separated by dielectric and in which each layer of the pair includes a plurality of spaced power, ground, and signal conductors, with the conductors of one layer of the pair being transverse to the conductors of the other layer of the pair, comprising:

providing a basic configuration for each layer in which each of a plurality of signal conductors has a predetermined width and is separated from adjacent power or ground conductors by predetermined spaces; and providing at least one signal conductor with a width that is substantially greater than the predetermined width, to reduce signal loss, and with spaces between the at least one signal conductor and adjacent conductors that are greater than the predetermined spaces to provide a predetermined desired characteristic impedance of a transmission line that includes the at least one signal conductor.

8. A method according to claim 7, wherein the width of the conductors adjacent to the at least one signal conductor is substantially greater than the width of conductors adjacent to some other signal conductors, to reduce return current loss.

9. A method according to claim 7, wherein said characteristic impedance of the transmission line that includes the at least one signal conductor is substantially the same as the characteristic impedance of transmission lines that include other signal conductors.

10. A method according to claim 7, wherein each of the predetermined spaces is a predetermined design minimum space.

11. A method according to claim 7, wherein the width of the at least one signal conductor is about two to three times greater than the predetermined width.

12. A method of manufacturing an electrical interconnect, comprising:

providing a first plurality of spaced conductors on a first side of a substrate;

providing a second plurality of spaced conductors on a second side of the substrate opposite the first side, the second plurality of conductors extending in a direction transverse to a direction of extension of the first plurality of conductors and each of the first and second plurality of conductors including power conductors, ground conductors and signal conductors between adjacent power or ground conductors;

interconnecting power conductors of the first plurality of conductors with power conductors of the second plurality of conductors, ground conductors of the first plurality of conductors with ground conductors of the second plurality of conductors, and signal conductors of the first plurality of conductors with signal conductor of the second plurality of conductors;

providing at least one signal conductor with a width that is substantially greater than a width of other signal conductors to reduce signal loss; and providing spaces between the at least one signal conductor and adjacent conductors that are substantially wider than spaces between other signal conductors and adjacent conductors, the greater width and wider spaces providing a predetermined characteristic impedance of a transmission line that includes the at least one signal conductor.

13. A method according to claim 12, wherein the width of the conductors adjacent to the at least one signal conductor is substantially greater than the width of some other conductors adjacent to some other signal conductors, to reduce return current loss.

14. A method according to claim 12, wherein the characteristic impedance of the transmission line that includes the at least one signal conductor is substantially the same as the characteristic impedance of other transmission lines that include other signal conductors.

15. A method according to claim 12, wherein each of the spaces between the other signal conductors and adjacent conductors is a predetermined design minimum space.

16. A method according to claim 12, wherein the width of the at least one signal conductor is about two to three times greater than the width of other signal conductors.

17. An interconnected mesh plane system according to claim 1, wherein the conductor of one layer of the pair are orthogonal to the conductors of the other layer of the pair.

18. A method according to claim 5, wherein the second direction is orthogonal to the first direction.

19. A method according to claim 8, wherein the conductors of one layer of the pair are orthogonal to the conductors of the other layer of the pair.

20. A method according to claim 13, wherein the second plurality of conductors extend in a direction orthogonal to the direction of extension of the first plurality of conductors.

* * * * *